METHOD OF TREATING THE SURFACE OF SEMICONDUCTOR DEVICES
FOR IMPROVING THE NOISE CHARACTERISTICS

Filed March 14, 1966

United States Patent Office 3,392,050

Patented July 9, 1968

3,392,050

METHOD OF TREATING THE SURFACE OF SEMICONDUCTOR DEVICES FOR IMPROVING THE NOISE CHARACTERISTICS

Fritz-Werner Beyerlein, Munich, Germany, assignor to Siemens Aktiengesellschaft, a corporation of Germany Filed Mar. 14, 1966, Ser. No. 534,227
Claims priority, application Germany, Mar. 16, 1965, S 95,977
5 Claims. (Cl. 117—200)

ABSTRACT OF THE DISCLOSURE

Disclosed is a method of treating the surface of semiconductor devices having at least one p-n junction to stabilize the noise characteristic. The method comprises coating the surface of the semiconductor device, immediately after etching, with a solution containing a boric acid ester and drying the surface of the thus coated semiconductor device. Preferred esters are boric acid trimethyl ester and boric acid triethyl ester.

My invention relates to a method of treating the surface of semiconductor devices having at least one p-n junction whereby surface-dependent, electrical parameters, such as the noise properties, are stabilized.

It was discovered that on the one hand the surface characteristics of the semiconductor device determine the stability of the blocking currents with respect to time, at a constant blocking voltage, and that, on the other hand, the surface properties of the semiconductor device considerably influence the noise characteristics of the finished structural component.

My research into the dependency of the noise characteristics on outside influences has shown that the noise characteristics depend to a high degree on the surface characteristics of the semiconductor body. This may be explained in that easily movable electrons are subject to greater local fluctuations then are bound electrons of stable surface complexes. By increasing the stability of the surface cohesion, it becomes possible to reduce sharply such local charge fluctuations which, among other things, are responsible for noise characteristics of the structural elements.

As was further shown, the noise factor is strongly increased by water upon the surface. The worsening of the noise properties which, with increasing amounts of moisture, may be explained by the mobility of the water ions.

It is an object of the invention, to considerably stabilize the surface of the semiconductor body and thereby to reduce widely the detrimental effect of the moisture.

This is achieved according to my invention by treating the semiconductor device immediately after etching with boron compounds which are especially effective as electron acceptors, and which can enter into a hybrid combination with the free electrons, located at the surface of the semiconductor, and are dried thereafter. Boric acid ester, for example boric acid trimethyl ester or boric acid triethyl ester, is found to be particularly favorable. These compounds are applied to the semiconductor surface in dissociated form. Alcohols, for example are suitable solvents. It is particularly favorable to use the alcoholic component of the ester as the solvent; for example, methyl alcohol for boric acid trimethyl ester.

The surface treatment is preferably carried out by immersing the semiconductor device, directly after the etching, into a bath comprising an alcohol solvent of an appropriate boric acid ester. Following the immersion, the semiconductor device is dried in a furnace at approximately 80°–150° C. Finally, the semiconductor device together with a filler substance and a dry getter is placed in a housing, which is subsequently closed. Absorbent or reactive drying agents are suitable as dry getters. Examples thereof are calcium oxide, magnesium oxide and boron trioxide.

The method of the invention, may be favorably used in the production of transistors, whose noise characteristics are considerably improved through the stabilization of the surface. Furthermore, my method not only improves the noise characteristics but also contributes to the stabilization of other surface dependent electrical parameters, as for example surface recombination, biasing voltage or biasing current.

Further details of the invention may be seen on hand of the embodiments based on the figures in which.

In one example of the method, a semiconductor device, provided with a p-n junction, is first etched in a known manner and subsequently is rinsed several times with distilled water. Following this, the semiconductor device is immersed into an alcoholic solution of boron triethyl ester. This produces a protective layer on the semiconductor surface. Following this treatment, the semiconductor device is dried in a furnace for several hours, for example 16 hours. The temperature amounts to 80°–150° C.

The following reactions occur during the processing of a freshly etched germanium surface with a boric acid ester:

(a)

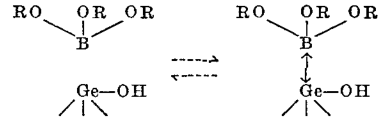

(b)

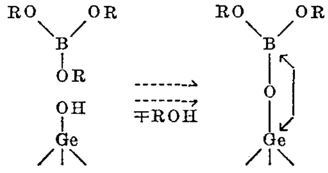

(c)

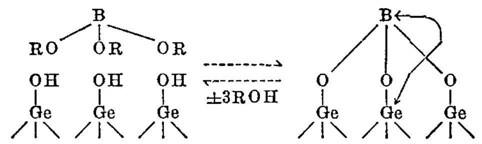

(d)

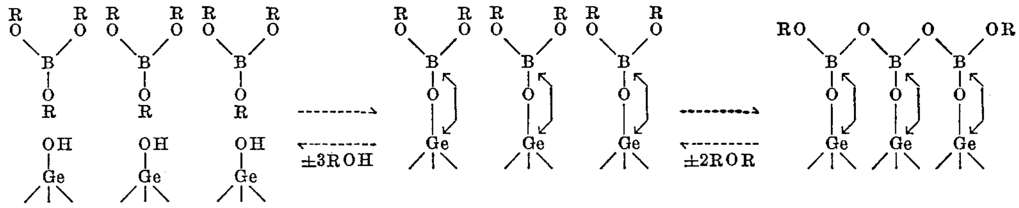

R depicts an organic radical, for example a methyl or ethyl group.

During the action of the boron compound upon the germanium surface, the free 2 p-orbital of the boron compound becomes filled with an electron of the germanium crystal by obtaining a $sp^3$ hybridization at the boron. The small size of the boron surface compound allows esterification and the formation of a coordinate boron acceptor compound at each germanium surface atom. The reaction of the two compound types results in a very stable surface complex with negative charge.

As tests have shown, the surface dependent noise properties of an alloyed germanium p-n-p transistor is not dependent upon the charge of the surface edge layer, but only on the bonding condition of the bonding electrons of the lattice of the germanium crystals, broken off at the surface.

Figure 1:
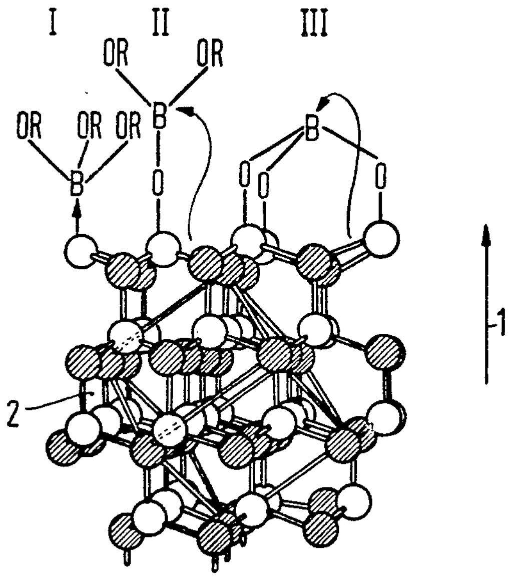
FIG. 1 shows possible boron types at a germanium 111 surface.

FIG. 1 illustrates the possible types of boron compounds deposited at a germanium 111 surface. I shows the formation of a simple deposit compound, in this instance, an acceptor complex. The compound type, shown at II, corresponds to the esterification of an OH group, with simultaneous formation of a coordinate compound. III depicts the esterification of three OH groups with three different germanium atoms, with the simultaneous development of a coordinate compound. Arrow 1 indicates the orientation of the germanium crystal 2. In this case, the direction corresponds to the 111-direction.

The semiconductor devices, which were thus provided with a protective surface layer, are next dried in a furnace and placed into a separate housing. Subsequently, the housing is filled with an insulating mass, for example with silicone rubber, or silicone oil. It is favorable, at the same time, to add a dry getter to the filler material. Oxides such as calcium oxide, magnesium oxide or boron tri-oxide have been found to be particularly suitable. Boron trioxide not only has the advantage of energetically binding the penetrating moisture, but also counteracts any dissociation of the boric acid ester. In place of the oxide, i.e. reactive dry getter, other materials indicated as absorptive dry getters, as for example zeolite or silicagel may be used. The housing is sealed as a final step.

Figure 2:
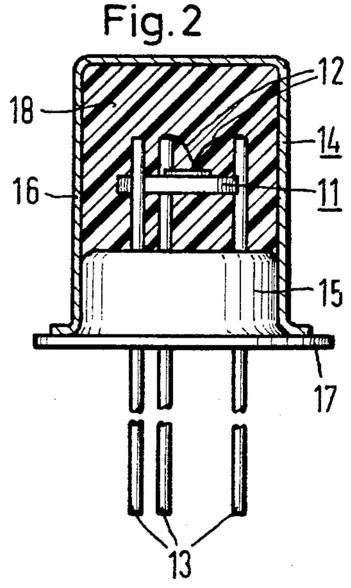
FIG. 2 shows a p-n-p germanium transistor.

The finished structural component corresponds, for example to that illustrated in FIG. 2. The germanium p-n-p transistor 11, which is connected with the lead-ins 13, by means of the connecting wires 12, is located in a housing 14. The housing 14 consists of a base 15 and a metal cap 16, both of which are attached at a bottom plate 17. The hollow space remaining between the base 15, the cap 16 and the semiconductor structural component is filled in with a sealing mass 18, for example a silicone resin, to which calcium oxide has been added as a reactive dry getter. The admixed calcium oxide reacts with any moisture penetrating and thus offers an additional protection for the semiconductor structural component 11 provided with a surface layer of boric acid triethyl ester.

The method of surface treatment, according to the invention, is not limited to germanium transistors only, but rather, it can be used in all semiconductor devices having a p-n junction, for example diodes, photo devices and the like. Furthermore, the invention is not limited to germanium; but rather other semiconductor materials such as silicon or $A^{III}B^{V}$ compounds may be utilized in lieu thereof.

I claim:

1. Method of treating the surface of semiconductor devices, having at least one p-n junction, which comprises coating the surface of the semiconductor device, immediately after etching, with a solution containing a boric acid ester and drying the surface of the coated semiconductor device whereby the noise characteristic is stabilized.

2. The process of claim 1, wherein the boric acid ester is boric acid trimethylester.

3. The process of claim 1, wherein the boric acid ester is boric acid triethyl ester.

4. The process of claim 1, wherein the boron compounds are dissolved in an alcohol solution.

5. The process of claim 1, wherein the treated-device is dried at a temperature of 80°–150° C.

References Cited

UNITED STATES PATENTS

| | | | |
|---|---|---|---|
| 2,798,189 | 7/1957 | Alexander | 148—15 |
| 3,122,817 | 3/1964 | Andrus | 148—187 |

HYLAND BIZOT, *Primary Examiner.*